United States Patent [19]

Ajika et al.

[11] Patent Number: 5,275,629
[45] Date of Patent: Jan. 4, 1994

[54] SEMICONDUCTOR DEVICE MANUFACTURING APPARATUS

[75] Inventors: Natsuo Ajika; Masahiro Shimizu; Takehisa Yamaguchi, all of Itami, Japan

[73] Assignee: Mitsubishi Denki Kabushiki Kaisha, Tokyo, Japan

[21] Appl. No.: 762,355

[22] Filed: Sep. 19, 1991

[30] Foreign Application Priority Data

Jan. 17, 1991 [JP] Japan .................................. 3-15680

[51] Int. Cl.$^5$ .............................................. C23C 16/00
[52] U.S. Cl. ................................... 29/25.01; 118/725; 118/728
[58] Field of Search ............... 29/25.01; 118/725, 50.1, 118/728; 204/192.13, 192.33, 298.03

[56] References Cited

U.S. PATENT DOCUMENTS

| 4,796,562 | 1/1989 | Brors et al. | 118/728 |
| 4,821,674 | 4/1989 | de Boer et al. | 118/666 |
| 4,956,538 | 9/1990 | Moslehi | 219/121.6 |

OTHER PUBLICATIONS

Wong, "Single Wafer RTP-CVD Epitaxial Deposition Technology", Solid State Technology, 1989, pp. 53-54.
Campbell et al, "Very Thin Silicon Epitaxial Layers Grown Using Rapid Thermal Vapor Phase Epitaxy", Journal of Vacuum Science, No. B7, 1989, pp. 1080-1083.
Gibbons et al, "Limited Reaction Processing: Silicon Epitaxy", Applied Physics Letters, vol. 47, No. 7, 1985, pp. 721-723.

Primary Examiner—Olik Chaudhuri
Assistant Examiner—Ramamohan Rao Paladugu
Attorney, Agent, or Firm—Leydig, Voit & Mayer

[57] ABSTRACT

A semiconductor device manufacturing apparatus has a first space and a second space in a process chamber in which a semiconductor wafer is accommodated, the first and second spaces being separated by the semiconductor wafer. A process gas port opens into the first space adjacent to the obverse surface of the semiconductor wafer, and an infrared light transmission window is formed in a wall of the chamber at the second space facing the reverse surface of the semiconductor wafer. No layers are deposited on the reverse surface of the semiconductor wafer and the infrared light transmission window so that the emissivity at the reverse surface of the semiconductor wafer is not changed during layer deposition. The temperature during processing can therefore be monitored accurately with a pyrometer, and a reduction in the transmissivity of the window is prevented.

6 Claims, 2 Drawing Sheets

SEMICONDUCTOR DEVICE MANUFACTURING APPARATUS

BACKGROUND OF THE INVENTION

1. Field of the Invention

This invention relates to semiconductor device manufacturing apparatus and, more particularly, to a semiconductor device manufacture apparatus for rapid thermal chemical vapor deposition (RTCVD) utilizing a short-time heat treatment.

2. Description of the Related Art

FIG. 3 is a schematic cross-sectional view of a conventional semiconductor manufacturing apparatus, e.g., an RTCVD apparatus. A semiconductor wafer 2 is accommodated in a process chamber 1 and supported by a susceptor 3. A door 4 for introduction of a semiconductor wafer is provided at an end of the process chamber 1, and a process gas introduction port 5 and a discharge port 6 are provided at the other end. Tungsten halogen lamps 7 for heating the semiconductor wafer 2 and a pyrometer 8 for measuring the temperature of the semiconductor wafer 2 are provided at the periphery of the process chamber 1.

The thus-constructed conventional semiconductor device manufacturing apparatus is used as described below. First, the door 4 is opened, semiconductor wafer 2 is introduced into the process chamber 1 and is placed on the susceptor 3, and the door 4 is thereafter closed. Next, the interior of the process chamber 1 is evacuated through the discharge port 6, and a desired process gas is introduced into the process chamber 1 through the process gas introduction port 5. After a predetermined gas flow rate and a predetermined pressure have been reached and stably maintained, the tungsten halogen lamps 7 are energized to heat the semiconductor wafer 2. Then, the temperature of the semiconductor wafer 2 is monitored by the pyrometer 8, and RTCVD is effected at the set temperature for the set time.

This semiconductor device manufacturing apparatus entails problems described below. The first problem is temperature measurement. To measure the temperature with accuracy by using the pyrometer 8, it is necessary to know the emissivity of the wafer 2 at the measurement wavelengths at the measured surface, i.e., the reverse surface of the semiconductor wafer 2 in this case. This emissivity is a sensitive function of the condition of the reverse surface of the semiconductor wafer 2. For example, in the conventional RTCVD apparatus, the emissivity at the reverse surface of the semiconductor wafer 2 changes with time because a layer is also deposited on this surface. It is therefore impossible to monitor the temperature with the pyrometer 8.

Second, at least part of the process chamber 1 is made of a material capable of transmitting infrared rays, e.g., quartz as a window, since the tungsten halogen lamps 7 are used for the light source to heat the semiconductor wafer 2 with infrared rays. Since such a window material does not completely transmit infrared rays, the window member itself is also heated up, and the temperature thereof is increased. Therefore a layer is also deposited on the window member, so that the infrared ray transmissivity is reduced. A vicious cycle thereby arises; the temperature of the window member is further increased and the layer deposition proceeds. Ultimately, infrared rays cannot reach the semiconductor wafer 2 which is to be heated.

SUMMARY OF THE INVENTION

In view of these problems, an object of the present invention is to provide a semiconductor manufacturing apparatus for accurate temperature monitoring even during semiconductor wafer processing and for preventing layer deposition on the window member.

To achieve this object, according to one aspect of the present invention, there is provided a semiconductor device manufacturing apparatus comprising: a chamber in which a semiconductor wafer is accommodated and in which a first space and a second space are defined; heating means disposed at the periphery of the chamber for heating the semiconductor wafer; and a pyrometer for monitoring the temperature of the semiconductor wafer wherein the first and second spaces are separated by the semiconductor wafer, a process gas introduction port opens into the first space adjacent to the obverse surface of a semiconductor wafer, and an infrared ray transmission window is disposed in a wall of the second space opposite the reverse surface of the semiconductor wafer.

According to another aspect of the present invention, there is provided a semiconductor device manufacturing apparatus comprising: a chamber in which a semiconductor wafer is accommodated and in which a first space and a second space are defined; heating means disposed at the periphery of the chamber for heating the semiconductor wafer; and a pyrometer for monitoring the temperature of the susceptor wherein the first and second spaces are separated by a susceptor on which the semiconductor wafer is supported, a process gas introduction port opening into the first space adjacent to the obverse surface of the semiconductor wafer, and an infrared ray transmission window is disposed in a wall of the second space opposite the susceptor.

DESCRIPTION OF THE PREFERRED EMBODIMENTS

Figure 1:
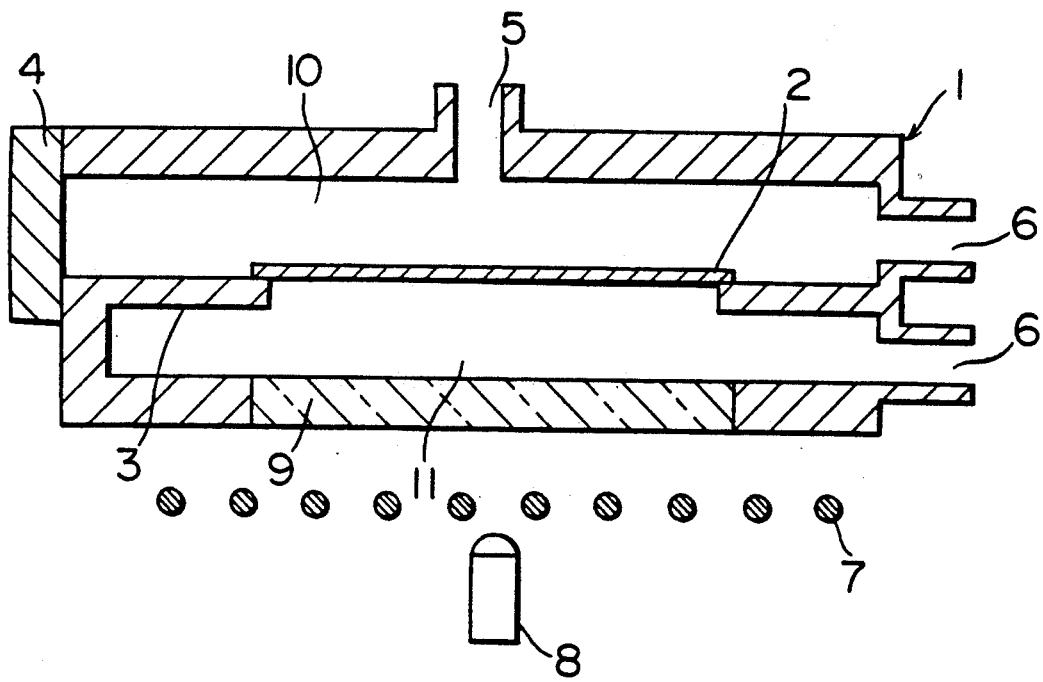
FIG. 1 is a schematic cross-sectional view of a semiconductor manufacturing apparatus in accordance with an embodiment of the present invention.
Figure 3:
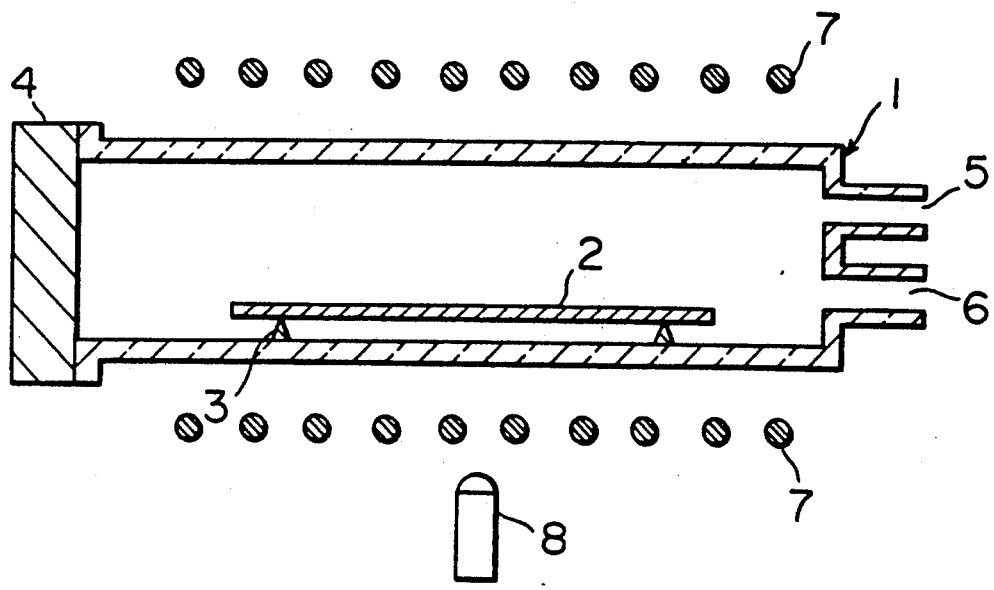
FIG. 3 is a schematic cross-sectional view of a conventional semiconductor manufacturing apparatus.

FIG. 1 schematically shows in section a semiconductor manufacturing apparatus, e.g., an RTCVD apparatus in accordance with an embodiment of the present invention. In FIG. 1, the same reference characters as FIG. 3 indicate the same or corresponding components. The interior of the process chamber 1 is separated into two spaces 10 and 11 by a semiconductor wafer 2 supported by a susceptor 3. A process gas introduction port 5 and a discharge port 6 communicate with the first space 1. Another discharge port 6 communicates with the second space 11, and an infrared ray transmission window 9 formed of, for example, quartz is disposed in a wall of the chamber 1 opposite the reverse surface of the semiconductor wafer 2. Tungsten halogen lamps 7 for heating the semiconductor wafer 2 and a pyrometer 8 for measuring the temperature of the semiconductor wafer 2 are disposed outside the chamber 1 opposite the infrared ray transmission window 9.

In the thus-constructed semiconductor device manufacturing apparatus, the semiconductor wafer 2 is first introduced into the first space 10 of the process chamber 1 and is placed on the susceptor 3. Next, the interiors of the first and second spaces 10 and 11 of the process chamber 1 are evacuated through the discharge ports 6, and a process gas is introduced into the first space 10 through the process gas introduction port 5. No process gas is introduced into the second space 11. At this time, it is not necessary to completely isolate the first and second spaces 10 and 11 from each other, but it is important to reduce the difference between the pressures in the spaces 10 and 11 by, for example, selecting the extent of evacuation of the second space 11 or introducing an inert gas into the second space 11, whereby damage of the semiconductor wafer 2 or a gas leak is prevented. Under this condition, the tungsten halogen lamps 7 are energized to heat the semiconductor wafer 2, and the temperature of the semiconductor wafer 2 is monitored by the pyrometer 8, thereby effecting RTCVD at the set temperature for the set time. During this process, layer deposition is not effected on the reverse surface of the semiconductor wafer or on the inner surface of the infrared ray transmission window 9 since no process gas is introduced into the second space 11. Thus, accurate temperature monitoring by the pyrometer 8 can be achieved. It is also possible to prevent a reduction in infrared rays passing through the infrared ray transmission window 9 and, hence, a reduction in the processing efficiency. It is thereby possible to manufacture a semiconductor device accurately with improved efficiency.

Figure 2:
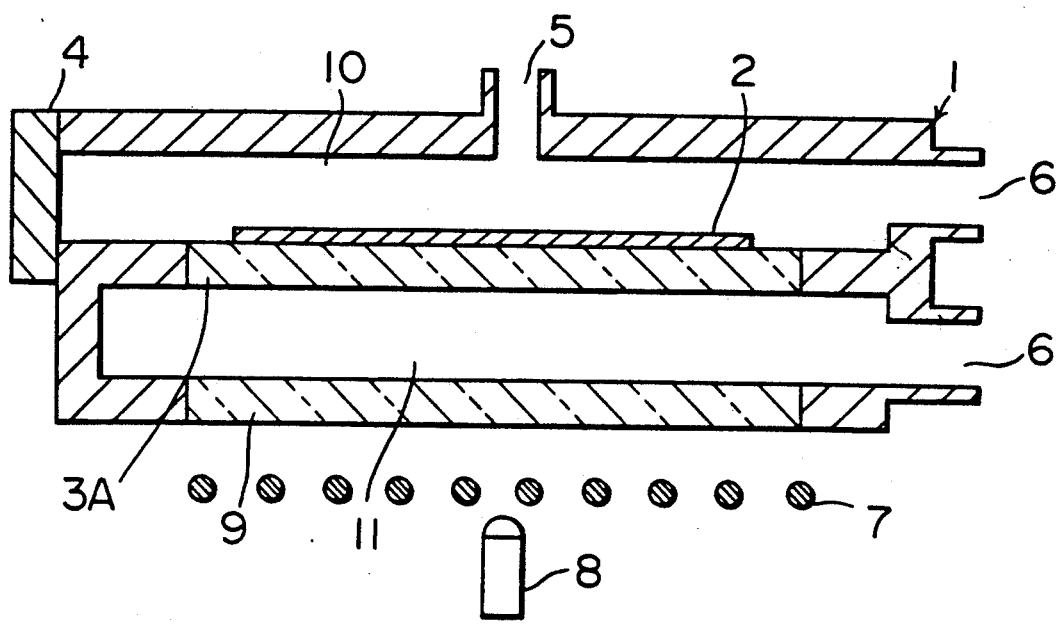
FIG. 2 is a schematic cross-sectional view of a semiconductor manufacturing apparatus in accordance with another embodiment of the present invention.

Next, another embodiment of the present invention will be described with reference to FIG. 2. In this embodiment, first and second spaces 10 and 11 are separated by a susceptor 3A formed of a material having a small heat capacity, e.g., carbon or SiC. Semiconductor wafer 2 is placed on the susceptor 3A. This construction enables, as well as the effects of the embodiment shown in FIG. 1, stable temperature measurement irrespective of the condition of the reverse surface of the semiconductor wafer 2, because the same surface (reverse surface of the susceptor 3A) is constantly monitored with the pyrometer 8. In the case of the arrangement shown in FIG. 1, the susceptor 3 is in contact with an outer circumferential portion of the semiconductor wafer 2 and there is therefore a risk a heating nonuniformity. In contrast, in the embodiment shown in FIG. 2, the heating uniformity can be improved because the susceptor 3A employed is greater in diameter than the semiconductor wafer 2.

In the above-described embodiments, tungsten halogen lamps are used for the heating light source, but xenon lamps or the like may alternatively be used as the light source lamps to attain the same effects as in the above.

What is claimed is:

1. A semiconductor device manufacturing apparatus comprising:
   a chamber for accommodating a semiconductor wafer and including mutually isolated first and second spaces separated by a wall including a susceptor for supporting a semiconductor wafer accommodated in the first space in the chamber, the semiconductor wafer accommodated in the chamber having a first surface exposed to the first space and a second surface contacting the susceptor;
   heating means disposed outside the chamber adjacent the second space for heating the susceptor;
   a pyrometer disposed outside the chamber adjacent the second space for monitoring the temperature of the susceptor;
   a process gas introduction port opening into the first space for supplying gases to deposit a film on the first surface of the semiconductor wafer accommodated in the first space in the chamber; and
   an infrared light transmission window disposed in a wall of the chamber at the second space between the susceptor and the pyrometer.

2. The apparatus according to claim 1 wherein said heating means includes a lamp.

3. The apparatus according to claim 2 wherein said lamp is a tungsten lamp.

4. The apparatus according to claim 2 wherein said lamp is a xenon lamp.

5. The apparatus according to claim 1 wherein the susceptor and a semiconductor wafer accommodated in the chamber each have diameters and the diameter of the susceptor is greater than the diameter of the semiconductor wafer.

6. The apparatus according to claim 1 wherein the infrared transmission window is disposed between the heating means and the susceptor.

* * * * *